(12) United States Patent
DiCarlo et al.

(10) Patent No.: US 8,194,410 B2
(45) Date of Patent: Jun. 5, 2012

(54) PRINTED CIRCUIT BOARD SENSOR MOUNTING AND ALIGNMENT

(75) Inventors: Derek J. DiCarlo, San Jose, CA (US);
Vu T. Vo, Salinas, CA (US); Gregory A. Fosnes, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 194 days.

(21) Appl. No.: 12/758,642

(22) Filed: Apr. 12, 2010

(65) Prior Publication Data
US 2011/0242776 A1  Oct. 6, 2011

Related U.S. Application Data

(60) Provisional application No. 61/321,464, filed on Apr. 6, 2010.

(51) Int. Cl.
*H05K 7/00* (2006.01)
*H05K 13/04* (2006.01)
(52) U.S. Cl. .......... 361/760; 361/784; 361/785; 29/832; 29/834; 29/836; 174/260
(58) Field of Classification Search .......... 361/732, 361/736–742, 756, 760–767, 773, 785, 791; 174/250–267; 29/825–852
See application file for complete search history.

(56) References Cited

U.S. PATENT DOCUMENTS

| 5,773,913 | A | * | 6/1998 | Casselden | 310/338 |
| 5,897,611 | A | | 4/1999 | Case et al. | |
| 6,669,600 | B2 | * | 12/2003 | Warner | 482/8 |
| 6,953,031 | B2 | * | 10/2005 | Ishihara | 123/568.21 |
| 7,196,331 | B2 | | 3/2007 | Heismann | |
| 7,291,023 | B1 | | 11/2007 | Still et al. | |
| 2005/0029479 | A1 | * | 2/2005 | Ishihara | 251/129.15 |
| 2010/0212941 | A1 | * | 8/2010 | Higuchi | 174/257 |
| 2010/0263462 | A1 | * | 10/2010 | Nakamura | 73/866.5 |

FOREIGN PATENT DOCUMENTS
JP  02003142210 A  *  5/2003
* cited by examiner

*Primary Examiner* — Michail V Datskovskiy
(74) *Attorney, Agent, or Firm* — Beyer Law Group LLP

(57) ABSTRACT

Sensors modules adapted to be mounted to a motherboard under challenging conditions by using automated manufacturing processes are disclosed. A sensor module can include a sensor mounted to a sensor PCB, a connector coupled to the sensor and having a plurality of guide pins extending therefrom in a vulnerable manner, with the guide pins being adapted to be inserted into guide pin holes on an associated motherboard, and a disposable carrier adapted to hold the connector and protect the guide pins thereof prior to mounting. The disposable carrier is removed from the sensor module before the sensor module is mounted directly to a motherboard by press-fitting the guide pins into guide pin holes on the motherboard and soldering connections thereto in an automated surface mounting operation. Disposable carrier protected sensor modules can be stored and processed in a tray or tape-and-reel automated manufacturing system.

20 Claims, 8 Drawing Sheets

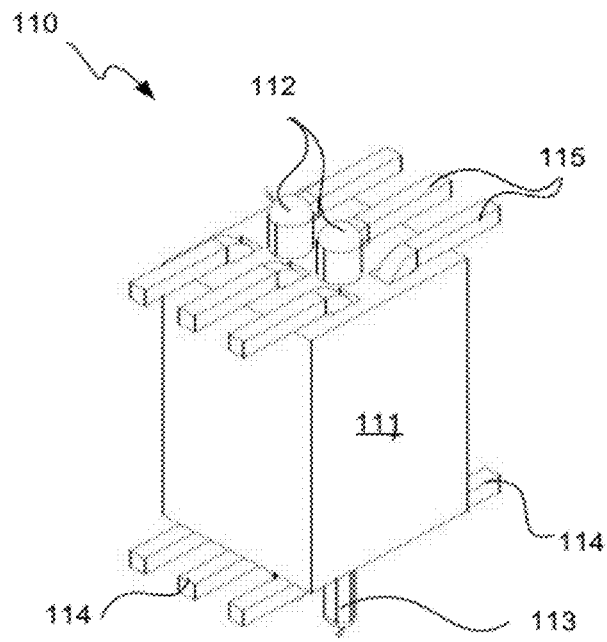 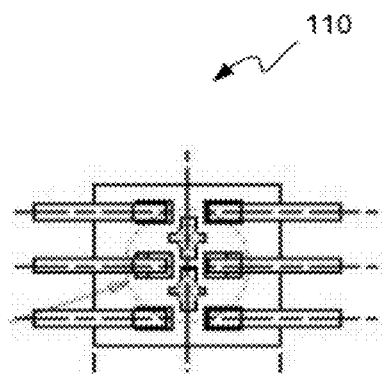
FIG. 2A  FIG. 2B
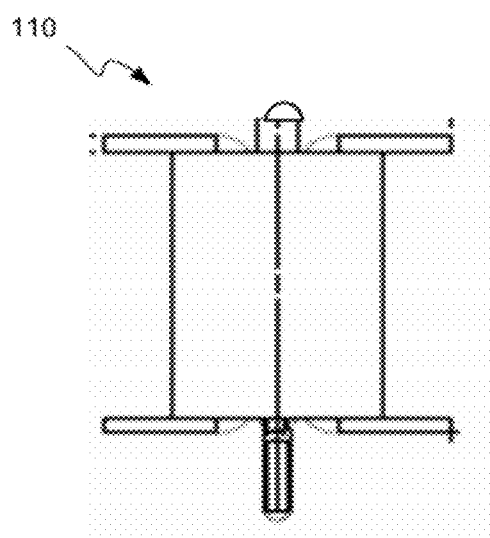 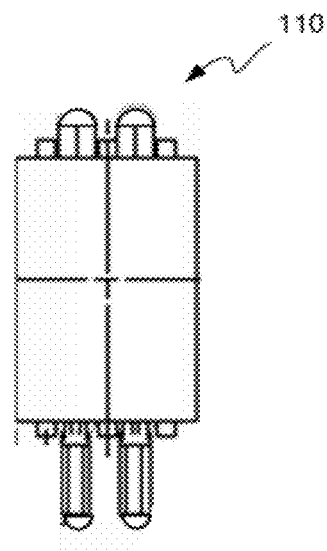
FIG. 2C  FIG. 2D

PRINTED CIRCUIT BOARD SENSOR MOUNTING AND ALIGNMENT

CROSS REFERENCE TO RELATED APPLICATION

This application claims priority to U.S. Provisional Patent Application No. 61/321,464, filed Apr. 6, 2010, and entitled "PRINTED CIRCUIT BOARD SENSOR MOUNTING AND ALIGNMENT," which is incorporated herein by reference in its entirety and for all purposes.

TECHNICAL FIELD

The present invention relates generally to the manufacture of printed circuit boards, and more particularly to the mounting and alignment of sensors on printed circuit boards.

BACKGROUND

Printed circuit boards ("PCBs") are made to be used in a wide variety of consumer devices and products, including appliances, televisions, cellular telephones, laptop and desktop computers, and the like. A given PCB can include a wide variety of associated processors, ports, input and output connectors and other devices, such as, for example, sensors and indicators. Such PCB sensors can be used for sensing and indicating temperature, light, magnetic fields, moisture, humidity, proximity, power and sounds, among other possible things. Indicators typically provide some form of user feedback, such as in the form of light or sound. A given sensor or indicator in a PCB related product, such as, for example, a Hall Effect sensor, often needs to be mounted and aligned quite specifically and with tight tolerances when mounted into a larger electronic system, such as a motherboard.

Modern designs of motherboards and other similarly large computing components have become quite complex, with increasing numbers of components packed into a tight and limited space. Mounting and alignment for any sensor to a motherboard, such as a PCB related Hall Effect sensor, can involve being located in an already crowded area, which can result in very particular requirements with respect to the actual manufacture or placement of the sensor. For example, some sensors that are designed to be located in a tight space between larger components on a densely packed motherboard can require installation by hand due to numerous challenging constraints. Such constraints can include very specific locating and orienting requirements for the sensor on the motherboard, as well as a need to protect uniquely designed and/or fragile components on the sensor and associated components.

In some applications, various custom designed sensor modules may not lend themselves to traditional robotic pick and place methods. Tight and accurate placement requirements and module designs that involve the exposure of fragile items are two situations that, alone or in combination, can result in a need for mounting by hand. For example, where a sensor module includes a sensor PCB and connector with locating and mounting pins exposed and extending therefrom, many automated processes will simply damage or tweak too many of the locating and mounting pins to enable the use of an automated system for mounting. Of course, any such instance where one or more automated manufacturing processes must be forgone in favor of manual labor can result in higher manufacturing costs and greater variances in product quality, among other negative consequences.

While many designs and techniques used with respect to mounting and aligning sensors with respect to motherboards or other larger system components have generally worked well in the past, there is always a desire to provide further designs and techniques for mounting sensors that are just as reliable yet more cost effective. In particular, what is desired are improved designs and techniques that enable sensors to be mounted and aligned accurately and in automated fashion into specific and tight locations on a motherboard.

SUMMARY

It is an advantage of the present invention to provide accurate and reliable automated mounting of sensor modules within tight locations on a motherboard or other large system component without damaging various vulnerable components on the sensor modules. This can be accomplished at least in part through the use of a removable carrier that is adapted to partially house and protect vulnerable or sensitive components of an assembled sensor and connector module prior to the actual automated mounting of the sensor and connector module onto a respective motherboard. Such a removable carrier can enable the use of an automated tray and/or tape and reel system such that numerous sensor and connector modules can be stored and handled in mass quantities without damaging the components thereof during automated manufacturing processes.

The end result is that a wider variety of sensor modules, both standard and customized, can be mounted to various rigid, flexible or hybrid motherboards or other suitable PCBs under greater demand conditions by still using automated processes. Such mountings can be by way of press fitting with pins, soldering and/or other suitable mounting approaches. Such pin press fitting and soldering can be used to mount the sensor to a module PCB, and can similarly be used to mount the assembled sensor module to a motherboard.

In various embodiments of the present invention, a sensor module adapted to be mounted to an associated printed circuit board using an automated process can include a sensor printed circuit board, a sensor mounted to the sensor printed circuit board, a connector coupled to the sensor printed circuit board, and a disposable carrier adapted to hold said connector. The connector can have a plurality of guide pins and/or electrical leads extending therefrom for mounting, and at least a portion of the guide pins can be adapted to be inserted and press fit into one or more guide pin openings on the associated printed circuit board. The disposable carrier can be adapted to protect the guide pins before the sensor module is mounted to the associated printed circuit board, and the disposable carrier can be removed from the sensor module before said sensor module is mounted directly to the associated printed circuit board in an automated surface mounting operation.

In various detailed embodiments, the disposable carrier enables the sensor module to be used in an automated tray or tape-and-reel system without a significant risk of damage to the extending and vulnerable guide pins. This disposable carrier can be formed from a plastic material, and can be recycled and/or reused with other sensor modules after being removed from its current sensor module. The connector can include a plurality of electrical leads extending therethrough, with said electrical leads permitting the sensor to be electrically coupled to the associated printed circuit board. In some embodiments, the sensor printed circuit board is spaced apart from the associated printed circuit board by the connector when said sensor module is installed into the associated printed circuit board. The sensor can be selected from any number of possible sensors, such as, for example, a Hall Effect sensor.

In some embodiments, the sensor printed circuit board can be coupled to the connector by way of additional guide pins on the connector that can be press fit. The sensor module can be adapted to be mounted between two or more input/output connectors at or near the edge of the associated printed circuit board, which can be a motherboard or other large computer component. In order to facilitate an automated pick and place process, such as through the use of associated robotic manufacturing devices, an adhesive material can be disposed along a top surface of the sensor module. The entire module can be lifted and place using this adhesive.

Further embodiments include various methods of mounting a sensor module to an associated printed circuit board using an automated process. Process steps can include forming a sensor module having a sensor printed circuit board, a sensor mounted thereto, a connector coupled to the sensor printed circuit board, and a disposable carrier adapted to hold and protect the sensor module, lifting the sensor module using an automated robotic process, removing the disposable carrier from the sensor module using an automated robotic process, wherein said disposable carrier removal exposes one or more mounting components on the connector, and mounting the sensor module to the associated printed circuit board using an automated robotic process, wherein said mounting step involves using said one or more exposed mounting components. Further process steps can include storing the sensor module in a storage component, and also removing a cover from the storage component to expose the sensor module thereby, such as before the lifting step. The storage component can comprise an automated tray or tape-and-reel.

The one or more mounting components can include a plurality of guide pins extending from the connector, and the mounting step can involve press fitting these guide pins into openings within the associated printed circuit board. In addition, or alternatively, the one or more mounting components can include a plurality of electrical leads extending from the connector, and the mounting step can include soldering said plurality of electrical leads to corresponding electrical leads on the associated printed circuit board. Additional method steps can involve recycling or reusing the disposable carrier with another different sensor module after the disposable carrier is removed from the sensor module. The various method steps can then be repeated with the new sensor module.

In still further embodiments, a motherboard can have one or more processors, one or more input/output ports in communication with at least one of said one or more processors, and a sensor module in communication with at least one of said one or more processors. Similar to the foregoing embodiments, the sensor module can be mounted to the motherboard using an automated process. The sensor module can include a sensor printed circuit board, a sensor mounted to the sensor printed circuit board, and a connector coupled to the sensor printed circuit board, said connector having a plurality of guide pins extending therefrom. At least a portion of the guide pins can be press fitted into one or more guide pin openings on the motherboard, and the sensor can be installed using a disposable carrier adapted to hold the connector and protect the guide pins thereof prior to mounting the sensor module to the motherboard. The disposable carrier is removed from the sensor module before the sensor module is mounted directly to the motherboard.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatuses and methods for accurately mounting and aligning sensors to PCBs in an automated process. These drawings in no way limit any changes in form and detail that may be made to the invention by one skilled in the art without departing from the spirit and scope of the invention.

FIG. 2A illustrates in side perspective view the exemplary connector of FIG. 1B according to one embodiment of the present invention.

FIG. 2B illustrates in top plan view the exemplary connector of FIG. 1B according to one embodiment of the present invention.

FIG. 2C illustrates in front elevation view the exemplary connector of FIG. 1B according to one embodiment of the present invention.

FIG. 2D illustrates in side elevation view the exemplary connector of FIG. 1B according to one embodiment of the present invention.

DETAILED DESCRIPTION

Figure 1A:
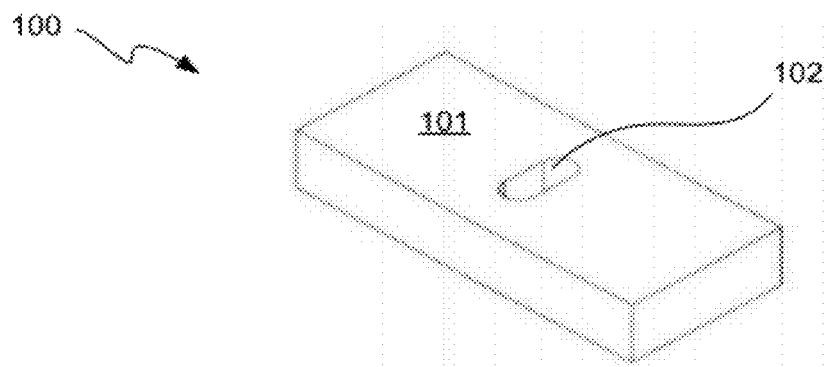
FIG. 1A illustrates in top perspective view an exemplary sensor PCB according to one embodiment of the present invention.

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

The present invention generally relates in various embodiments to sensors or indicators that can be precisely located on and mounted to a motherboard or other similar component in automated fashion during manufacturing, without undue risk of damage to various vulnerable mounting components. Although the following specific embodiments have been described with respect to a horizontally arranged, press-fit and soldered sensor module, it will be readily appreciated that any directional arrangement and any mounting technique for the sensor module can be used without departing from the inventive features described herein and claimed below. For example, the sensor module can be arranged vertically, or at an angle between horizontal or vertical. Alternatively, the sensor module can be arranged in an upside down position with respect to the majority of the motherboard or other primary computing device. In addition, other components such as an indicator, input/output port, or other device can be used with the current invention in addition to a sensor. Further alternative embodiments will be readily appreciated by those skilled in the art.

In various embodiments, a standard or customized sensor is mounted to a localized sensor PCB, which is in turn mounted to a connector that is adapted to connect the sensor PCB to a larger PCB or other component, such as a system motherboard. The combined sensor, sensor PCB and connector can be treated as a singular modular unit for purposes of handling and manufacture. This singular module can be treated like any other part that is traditionally installed on to a PCB, such that it can be manually placed, or alternatively, installed via automated processes that can utilize, for example, a typical tray or tape-and-reel system. In order to protect the various connectors, extensions and/or other vulnerable components that may extend from this sensor module, a disposable carrier or cover can be used to hold and support the sensor module while protecting such vulnerable items prior to installation to the final motherboard or other similar component. This disposable carrier can be removed from the rest of the sensor module as part of the installation process, and may be reused with other modules or otherwise recycled.

The sensor module and other components permits greater flexibility in the manufacturing process, and allows the sensor module to be installed to a motherboard or other final product in a particular order that may not be possible if the sensor were not configured into the particular module arrangement provided herein. Since the sensor module can be soldered or otherwise attached to the motherboard or final product at a wider range of times in the manufacturing process, it can be tested along with other motherboard components at various stages of the manufacturing process using industry standard methods such as circuit tests or functional tests, as may be desired. This can ensure proper connection and functionality early in the overall assembly process. The overall design and tooling of the sensor module, particularly with respect to the connector and its ability to be solder connected to the motherboard, can be more straightforward and simplified, even for customized applications. The result is a cheaper and more flexible sensor arrangement.

Referring first to FIG. 1A, an exemplary sensor PCB is illustrated in top perspective view according to one embodiment of the present invention. A localized sensor PCB 100 can include an active top surface 101 that is adapted to facilitate the PCB mounting of various electronic features, such as a Hall Effect sensor (not shown). Again, it will be readily appreciated that a wide variety of sensors, indicators, and/or other electrical components may be used in a similar modular manner, such that the present invention is not limited to Hall Effect sensors, or to sensors in general. Sensor PCB 100 can also include one or more holes or openings 102 therein, with such holes or openings being adapted to facilitate coupling or mounting to a separate connector. In some embodiments, top surface 101 can also include one or more locations adapted to host an adhesive (not shown), in order to facilitate the pick and placement of a sensor module including sensor PCB 100.

Figure 1B:
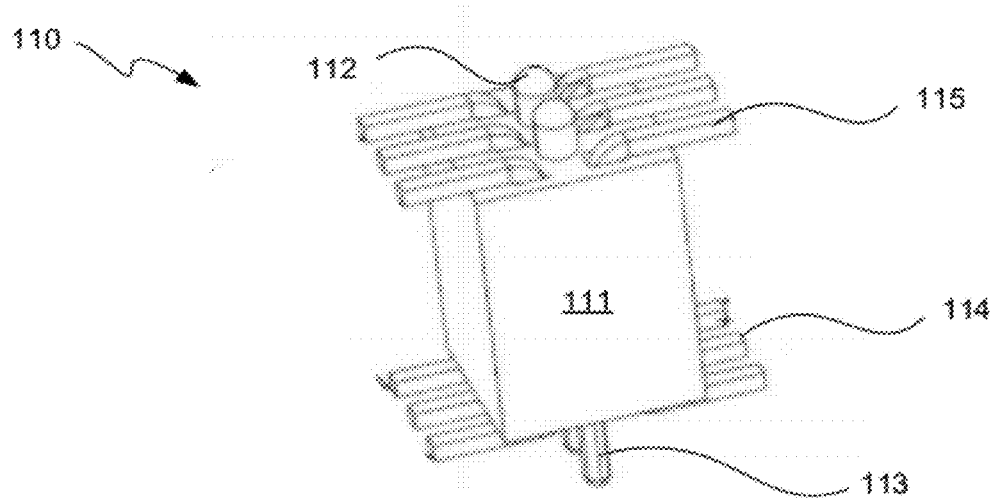
FIG. 1B illustrates in top perspective view an exemplary connector adapted to connect the exemplary sensor PCB of FIG. 1A to a motherboard according to one embodiment of the present invention.

FIG. 1B illustrates in top perspective view an exemplary connector adapted to connect the exemplary sensor PCB of FIG. 1A to a motherboard according to one embodiment of the present invention. Connector 110 can include a body portion 111, which can be formed from any of a number of suitable rigid materials, such as, for example, a plastic material. One or more mounting pins 112 extending from the top of connector 110 can be used to mount or couple the connector to sensor PCB 100, such as by way of a press fit into the opening or openings 102 of the sensor PCB. Similarly, one or more guide pins 113 extending from the bottom of connector 110 can be used to mount or couple the full sensor module by way of a press fit to an associated motherboard or other similar final product component.

Connector 110 can also include a plurality of electrical connectors or leads, such as electrical connectors 114 that are adapted to couple to electrical connections on an associated motherboard, and also electrical connectors 115 that are adapted to couple to electrical connections on the sensor PCB 100. Such electrical connections can be accomplished by way of soldering, for example. In various embodiments, the electrical leads 114 can run to or be coupled with the electrical leads 115, such that communications between the sensor PCB 100 and motherboard can be accomplished. Further views of connector 110 and its various components are provided in FIGS. 2A-2D, which depict the connector in side perspective, top plan, front elevation, and side elevation views respectively.

Figure 1C:
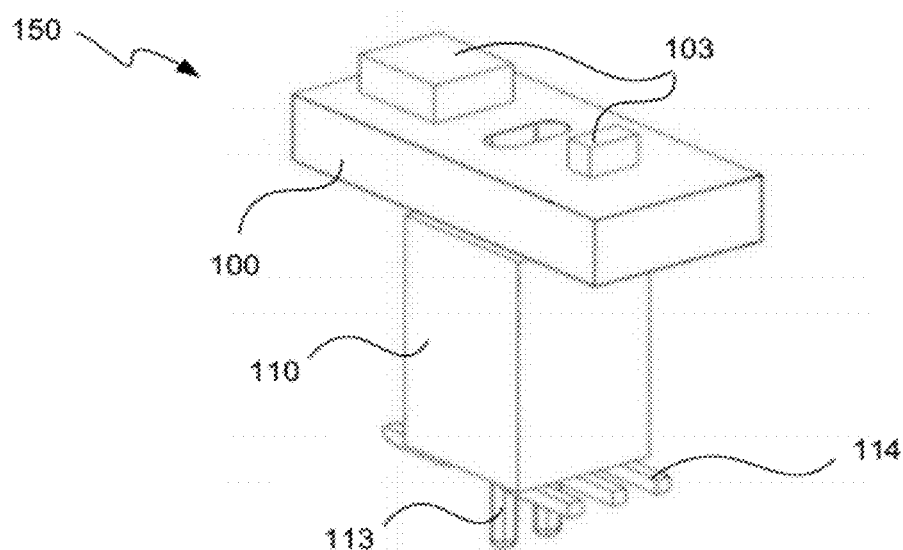
FIG. 1C illustrates in top perspective view the exemplary sensor PCB of FIG. 1A and the exemplary connector of FIG. 1B coupled together to form a sensor module according to one embodiment of the present invention.

Continuing with FIG. 1C, the exemplary sensor PCB of FIG. 1A and the exemplary connector of FIG. 1B are shown coupled together to form a sensor module in top perspective view. Sensor module 150 includes connector 110 that is mounted by way of pins to sensor PCB 100, which is shown as having various features 103 disposed thereon. Such features 103 can include, for example, the actual sensor component. The electrical leads at the top of connector can be appropriately soldered or otherwise connected to appropriate locations on sensor PCB 100, such that the lower set of electrical leads 114 are in communication with the sensor PCB. Guide pins 113 extend from the bottom of sensor module 150, and these guide pins are adapted to facilitate the mounting of the sensor module to an associated external printed circuit board, such as a motherboard.

Figure 3A:
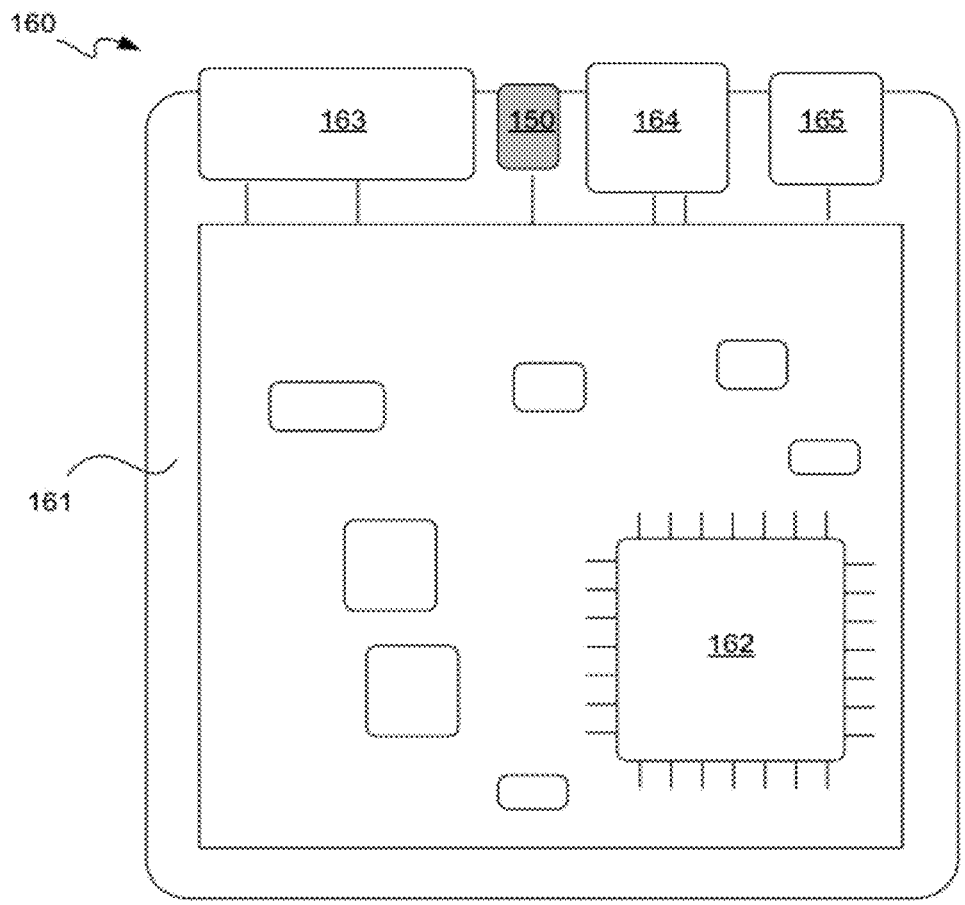
FIG. 3A illustrates in top plan view an exemplary motherboard having the sensor module of FIG. 1C installed thereon according to one embodiment of the present invention.
Figure 3B:
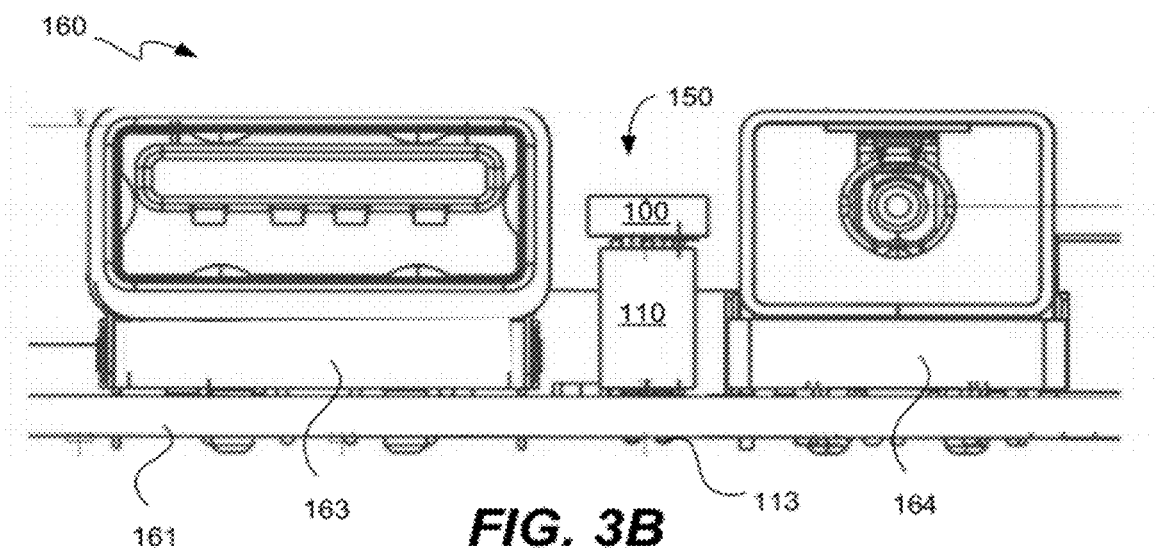
FIG. 3B illustrates in side elevation view the exemplary motherboard of FIG. 3A having the sensor module of FIG. 1C installed thereon according to one embodiment of the present invention.
Figure 4A:
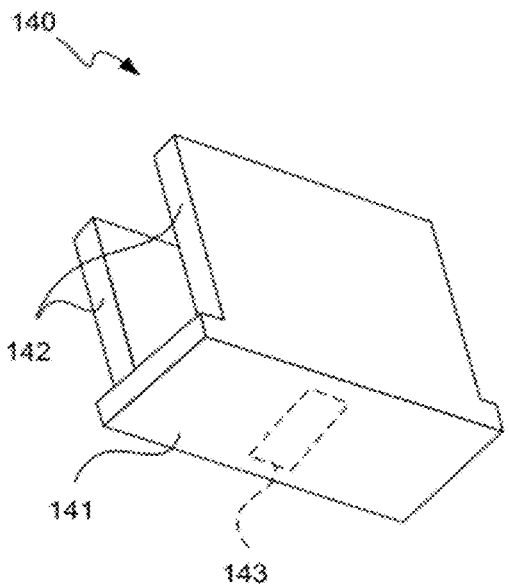
FIG. 4A illustrates in side perspective view an exemplary disposable carrier adapted to hold the sensor module of FIG. 1C according to one embodiment of the present invention.
Figure 4B:
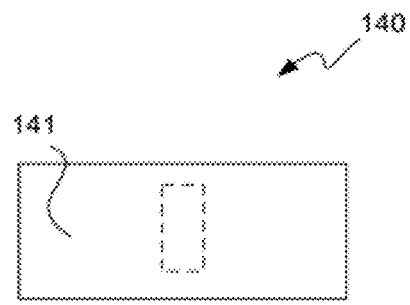
FIG. 4B illustrates in bottom plan view the exemplary disposable carrier of FIG. 4A according to one embodiment of the present invention.
Figure 4C:
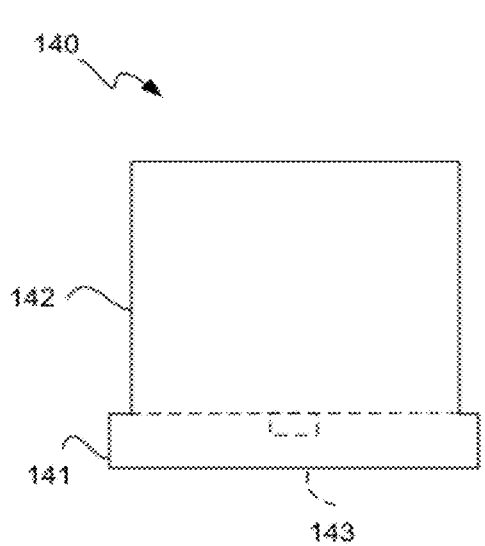
FIG. 4C illustrates in front elevation view the exemplary disposable carrier of FIG. 4A according to one embodiment of the present invention.
Figure 4D:
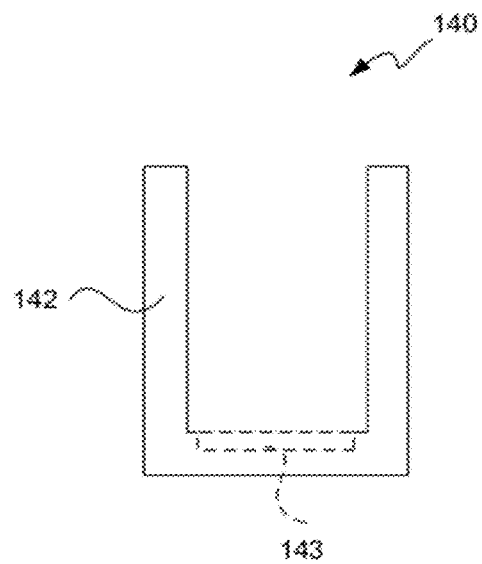
FIG. 4D illustrates in side elevation view the exemplary disposable carrier of FIG. 4A according to one embodiment of the present invention.

Turning next to FIGS. 3A and 3B an exemplary motherboard having the sensor module of FIG. 1C installed thereon according to one embodiment of the present invention is shown in top plan and side elevation views respectively. Motherboard 160 can include an actual board material 161 having various features and connections disposed thereon, such as one or more processors 162 and a plurality of input/output ports 163, 164, 165 located near an edge of the motherboard. In addition, a sensor module 150 can be located between two or more of the input/output ports 163, 164, and/or various other items on the motherboard 360. As shown in FIG. 3B, guide pins 113 can extend through and be press fit into one or more holes or openings in the board material 161 of motherboard 160. Various electrical connections between sensor module 150 and motherboard 160 may also be formed, such as by way of soldering electrical leads after the sensor module is mounted to the motherboard, as will be readily appreciated.

Although the use of a combined sensor module having a sensor PCB mounted to a connector can provide many advantages, one drawback is that a number of pins, connectors and/or other extensions or fragile or vulnerable components may be exposed, such that automated processes can tend to damage such vulnerable components. Accordingly, the use of some form of protector for the sensor module while the sensor module is being handled may be preferable.

FIGS. 4A through 4D illustrate an exemplary disposable carrier adapted to hold and protect various portions of the sensor module of FIG. 1C in side perspective, bottom plan, front elevation, and side elevation views respectively. Disposable carrier 140 effectively serves as a cover or sleeve that protects one or more fragile or vulnerable extensions or components of sensor module 150, such as, for example, the bottom guide pins 113. Disposable carrier 140 can include a bottom portion 141 that couples two or more open ended sidewalls 142 that are dimensioned to squeeze or press hold the sensor module when coupled together with the disposable carrier, and a recess 143 in the bottom portion. Recess 143 is adapted to accommodate at least a portion of the guide pins 113 of sensor module 150. Because sidewalls 142 are open ended at a top portion thereof, an appreciable amount of play or movable distance can be appreciated at the top of the sidewalls.

Where the distance between the sidewalls 142 is dimensioned to be a bit smaller than the thickness of connector 110, then the connector (and overall sensor module 150) can fit snugly within the disposable carrier 140 when the disposable carrier is fitted thereon. In some embodiments, such a snug fitting can involve a simple sliding fit, such that no glue or fasteners are used to couple the sensor module to the disposable carrier. Accordingly, the sensor module 150, and particularly the connector 110 thereof, is preferably slide fitted within disposable carrier 140 such that the disposable carrier can be readily removed, but remains on the sensor module as a cover due to frictional forces between the disposable carrier and the sensor module. For example, frictional forces between the front and back walls 111 of connector 110 and the sidewalls 142 of the disposable carrier 140 serve to keep the disposable carrier in place until it is time for it to be removed.

Figure 5A:
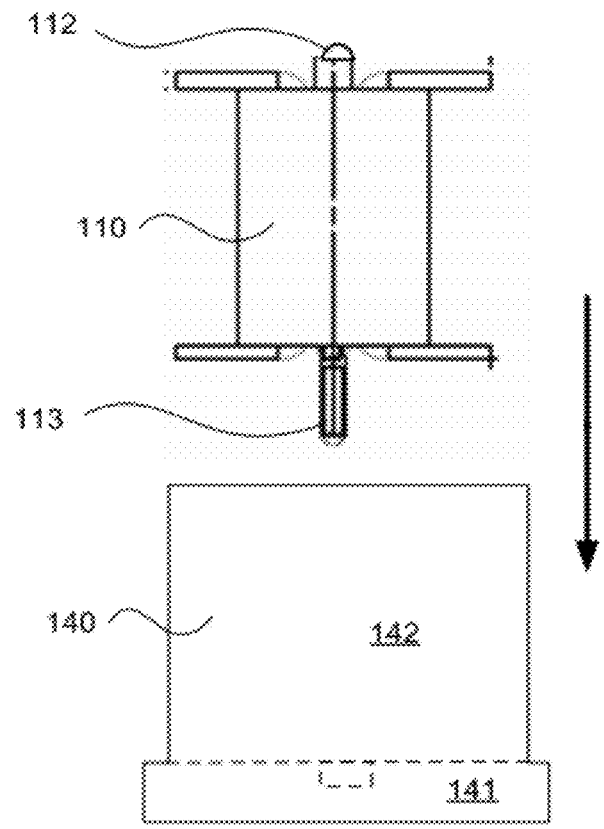
FIG. 5A illustrates in side elevation exploded view a sensor module and associated disposable carrier according to one embodiment of the present invention.
Figure 5B:
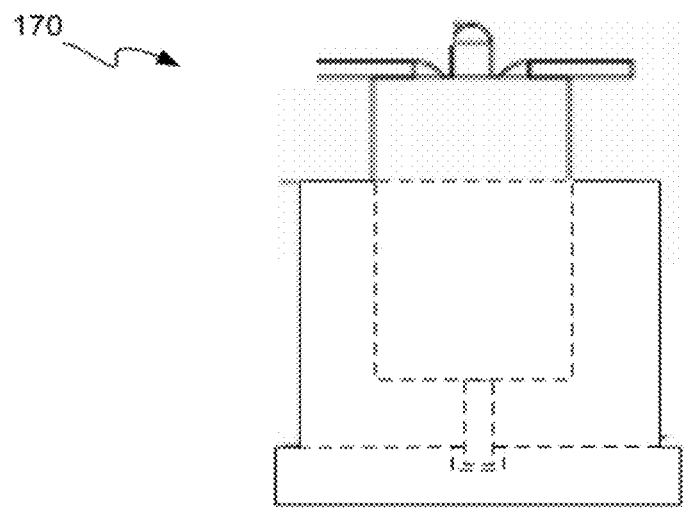
FIG. 5B illustrates in side elevation view the assembled sensor module and disposable carrier of FIG. 5A according to one embodiment of the present invention.

Such an arrangement is reflected in FIGS. 5A and 5B. FIG. 5A illustrates in side elevation exploded view a sensor module and associated disposable carrier, while FIG. 5B illustrates in side elevation view the assembled sensor module and disposable carrier of FIG. 5A. Although only connector 110 and its various components are shown in FIGS. 5A and 5B, it will be readily appreciated that the same arrangements and results will occur when sensor PCB 100 is mounted to the connector 110. As such, sensor PCB is not shown here for purposes of simplicity. Connector 110 (and as such module 150) is adapted to slide downward into the cavity within disposable carrier 140. Guide pins 113 can be at least partially received, restrained and protected by the recess 143 within bottom portion 141 of disposable carrier 140. The finally assembled product comprises a greater sensor module 170, which is a combination of reduced sensor module 150 and removable carrier 140.

Figure 6A:
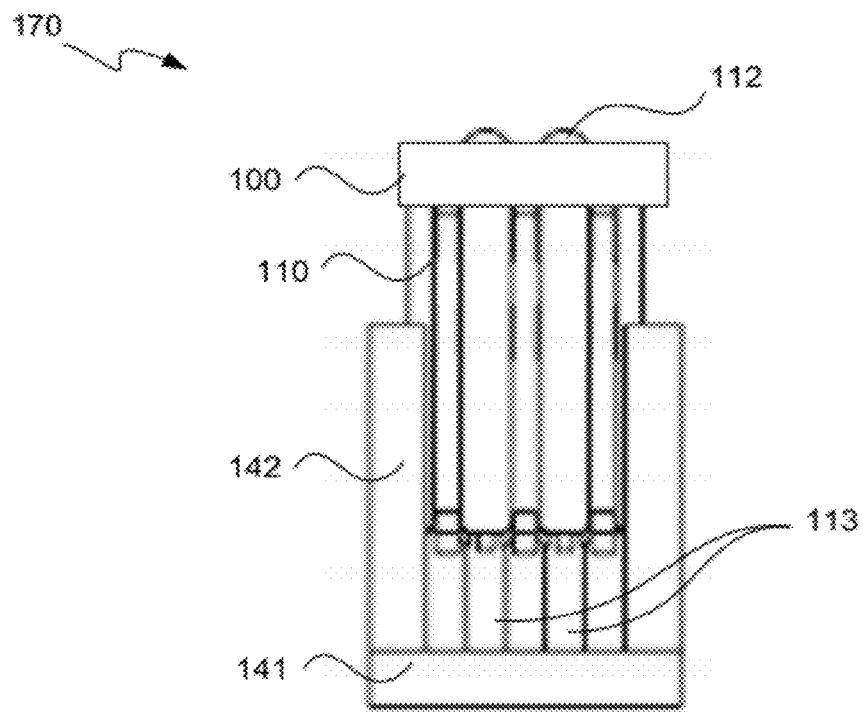
FIG. 6A illustrates in side elevation view the assembled sensor module and disposable carrier combination of FIG. 5B according to one embodiment of the present invention.
Figure 6B:
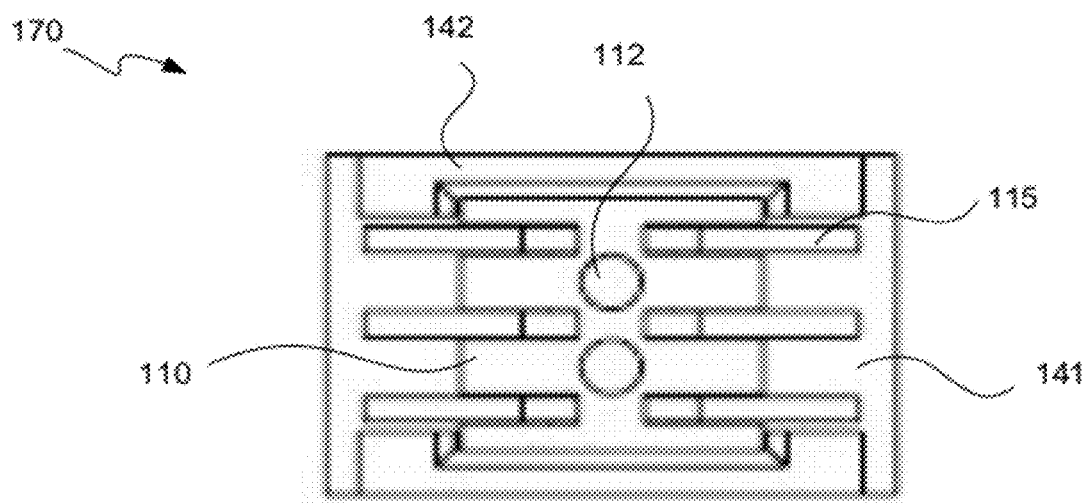
FIG. 6B illustrates in top plan view the assembled sensor module and disposable carrier combination of FIG. 5B according to one embodiment of the present invention.

The combined greater sensor module 170 is shown assembled and in alternative views in FIGS. 6A and 6B. FIG. 6A illustrates the combined assembly in side elevation view, while FIG. 6B illustrates in top plan view the assembled sensor module and disposable carrier combination. While the sensor PCB 100 is shown in FIG. 6A, this component is again removed for purposes of illustration for the top down view of FIG. 6B. Again, sidewalls 142 serve to squeeze or press hold connector 110, such that guide pins 113 and any other vulnerable items are protected by the bottom portion 141 and/or sidewalls of removable carrier 140. As shown in FIG. 6B, the edges of the sidewalls 142 can also have an extending lip, so as to facilitate the squeezing or press hold of the connector 110.

As will be readily appreciated, removable carrier 140 is typically only used to protect various portions of the reduced sensor module 150 during automated manufacturing processes, such that the removable carrier is not included on the final sensor module as installed to the associated motherboard or other final product. In particular, removable carrier 140 is removed as part of the manufacturing process. Such removal can take place just before the reduced or final sensor module 150 is installed to the motherboard, for example. The various handling, pick and place, carrier removal and mounting steps can be performed by automated processes, such as by robotic manufacturing components. Such steps or processes can be performed rapidly and accurately via automated systems, as will be readily appreciated, and the removable carrier 140 can serve to protect any vulnerable portions of the sensor module 150 during storage, transport and/or the automated manufacturing process.

Figure 7A:
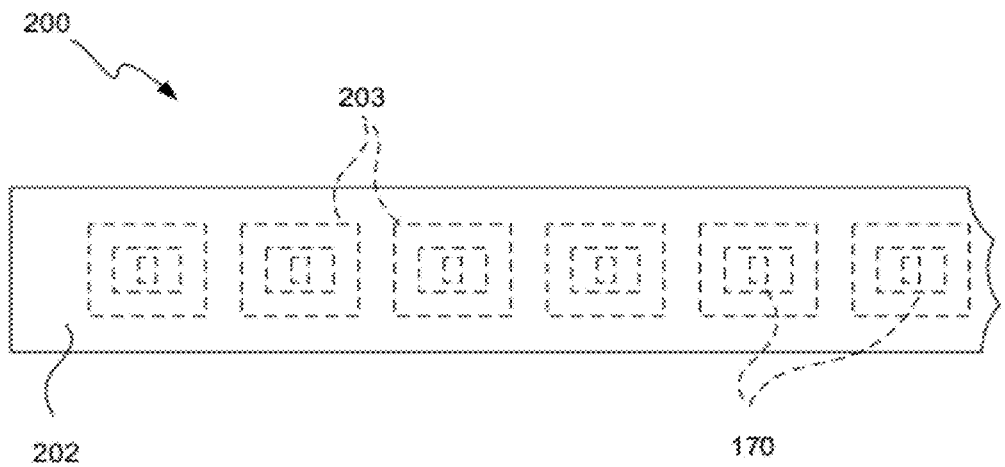
FIG. 7A illustrates in top plan view a series of assembled sensor modules and respective disposable carriers within a storage component according to one embodiment of the present invention.
Figure 7B:
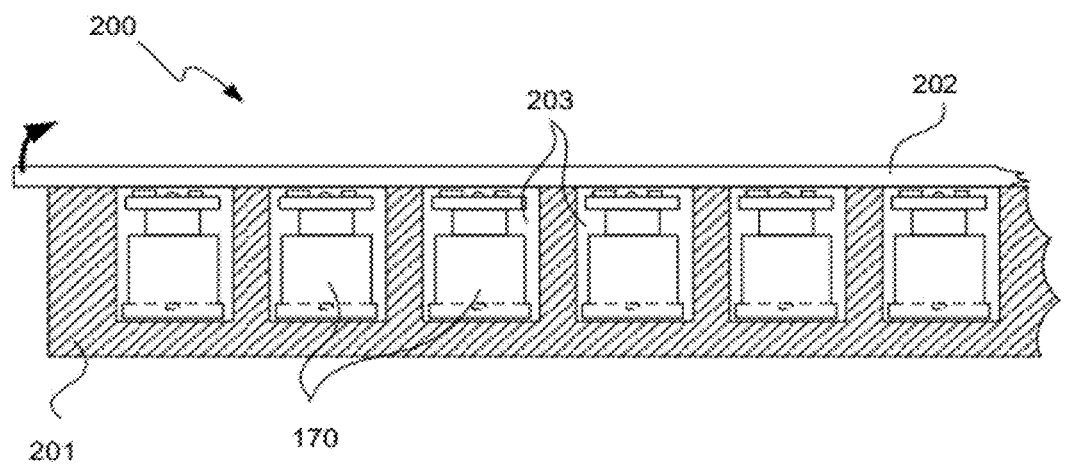
FIG. 7B illustrates in partial side cross-sectional view the series of assembled sensor modules and respective disposable carriers within a storage component of FIG. 7A according to one embodiment of the present invention.

FIG. 7A illustrates in top plan view, while FIG. 7B illustrates in side partial cross-sectional view a series of assembled sensor modules and respective disposable carriers within a storage component according to one embodiment of the present invention. Flexible reel tape 200 can be part of a traditional tape-and-reel manufacturing system, and can be adapted to store multiple assembled sensor modules 170, each having its own sensor PCB, connector and removable carrier. Reel tape 200 can include a removable tape 202 or other covering adapted to cover and contain the various sensor modules until such modules are to be installed to an associated motherboard. Reel tape 200 can include a plurality of wells 203 or other cavities, with each such well being dimensioned to contain a greater sensor module 170. Again, each greater sensor module 170 can include a sensor PCB 100, a connector 110 and a removable carrier 140. An adhesive situated atop each sensor module 170 can facilitate the ready pick and placement of each module by robotic processing components.

Figure 8:
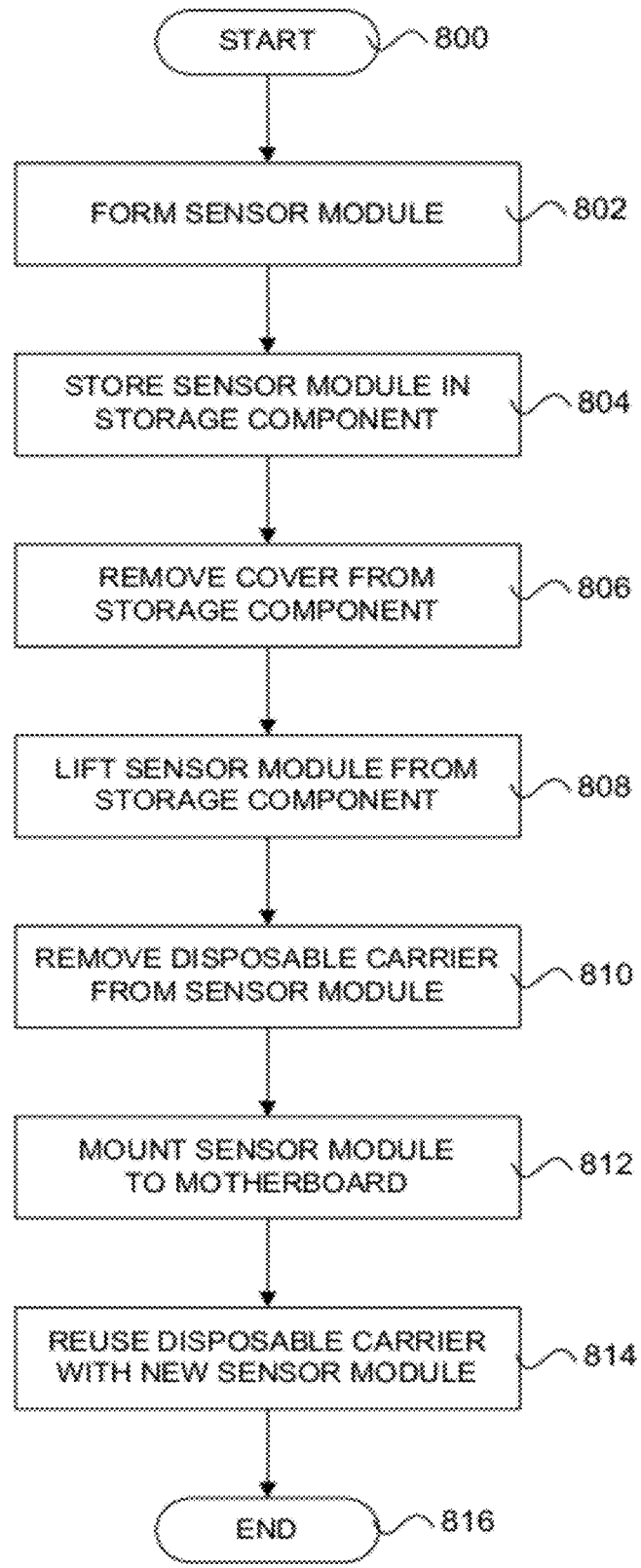
FIG. 8 provides a flowchart of an exemplary method of mounting a sensor module to a motherboard according to one embodiment of the present invention.

Turning lastly to FIG. 8, a flowchart of an exemplary method of mounting a sensor module to an associated printed circuit board using an automated process is provided. It will be readily appreciated that the various steps set forth can be implemented as desired, and that some steps may be removed, while others not shown may be added. Furthermore, the order of the various steps may be changed as may be appropriate for a given application, as will be readily appreciated. After a start step 800, a sensor module is formed at process step 802. Such a sensor module can include at least a sensor PCB and connector. In addition, such a sensor module can include a removable carrier. At a subsequent process step 804, the assembled sensor module is stored in a storage component, such as, for example, a traditional tray or tape-and-reel system. At following process step 806, a cover can be removed from the storage component. Such a cover can be the tape removed from the storing tape-and-reel system.

At subsequent process step 808, the sensor module can be lifted from the storage component, such as by an automated robotic component. Again, a glue, adhesive or other suitable substance or item may be used to facilitate this lifting process. The removable carrier can then be removed from the sensor module at process step 810, after which the sensor module is mounted to the motherboard at process step 812. Such a mounting can involve press fitting pins within receiving holes or openings, and/or can involve soldering one or more electrical leads to form electrical connection(s) thereby. Finally, the disposable carrier can optionally be recycled or reused with another different sensor module at process step 814. The method then ends at end step 816.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A sensor module configured to be mounted to a separate associated printed circuit board using an automated process, comprising:
   a sensor printed circuit board;
   a sensor mounted to the sensor printed circuit board;
   a connector coupled to the sensor printed circuit board, said connector having a plurality of guide pins extending therefrom, wherein at least a portion of said guide pins are configured to be inserted and press fit into one or more guide pin openings on the separate associated printed circuit board; and
   a disposable carrier that holds said connector and protects the guide pins thereof before said sensor module being mounted to the separate associated printed circuit board, wherein said disposable carrier is removed from the sensor module before said sensor module is mounted directly to the separate associated printed circuit board in an automated surface mounting operation.

2. The sensor module of claim 1, wherein said disposable carrier enables said sensor module to be used in an automated tray or tape-and-reel system without a significant risk of damage to said guide pins.

3. The sensor module of claim 1, wherein said connector includes a plurality of electrical leads extending therethrough, said electrical leads permitting the sensor to be electrically coupled to the associated printed circuit board.

4. The sensor module of claim 1, wherein said sensor printed circuit board is spaced apart from the associated printed circuit board by said connector when said sensor module is installed into the associated printed circuit board.

5. The sensor module of claim 1, wherein said sensor is a Hall Effect sensor.

6. The sensor module of claim 1, wherein said sensor printed circuit board is coupled to said connector by way of additional guide pins on the connector being press fit into one or more openings on the sensor printed circuit board.

7. The sensor module of claim 1, wherein said disposable carrier is formed from a plastic material.

8. The sensor module of claim 1, wherein said disposable carrier is reusable with another different sensor module after said disposable carrier is removed from the sensor module.

9. The sensor module of claim 1, wherein said sensor module is configured to be mounted between two or more input/output connectors at or near the edge of the separate associated printed circuit board.

10. The sensor module of claim 1, further including:
    an adhesive disposed along a top surface of said sensor module, said adhesive being adapted to facilitate the automated pick and placement of said sensor module by an associated robotic device.

11. A method of mounting a sensor module to a separate associated printed circuit board using an automated process, the method comprising:
    forming a sensor module having a sensor printed circuit board, a sensor mounted thereto, a connector coupled to the sensor printed circuit board, and a disposable carrier that holds and protects said sensor;
    lifting the sensor module using an automated robotic process;
    removing the disposable carrier from the sensor module using an automated robotic process, wherein said disposable carrier removal exposes one or more mounting components on said connector; and
    mounting said sensor module to the separate associated printed circuit board using an automated robotic process, wherein said mounting step involves using said one or more exposed mounting components.

12. The method of claim 11, further including the steps of:
    storing said sensor module in a storage component; and
    removing a cover from said storage component to expose the sensor module thereby.

13. The method of claim 12, wherein said storage component comprises an automated tray or tape-and-reel.

14. The method of claim 11, wherein said one or more mounting components include a plurality of guide pins extending from said connector, and wherein said mounting step includes press fitting said guide pins into openings within the associated printed circuit board.

15. The method of claim 11, wherein said one or more mounting components include a plurality of electrical leads extending from said connector, and wherein said mounting step includes soldering said plurality of electrical leads to corresponding electrical leads on the associated printed circuit board.

16. The method of claim 11, wherein said sensor is a Hall Effect sensor.

17. The method of claim 11, wherein said disposable carrier is formed from a plastic material.

18. The method of claim 11, further including the step of:
reusing said disposable carrier with another different sensor module after said disposable carrier is removed from the sensor module.

19. The method of claim 11, wherein said lifting step involves utilizing an adhesive disposed along a top surface of said sensor module.

20. A motherboard, comprising:
one or more processors;
one or more input/output ports in communication with at least one of said one or more processors; and
a sensor module in communication with at least one of said one or more processors, said sensor module being mounted to the motherboard using an automated process, wherein said sensor module includes a sensor printed circuit board, a sensor mounted to the sensor printed circuit board, and a connector coupled to the sensor printed circuit board, said connector having a plurality of guide pins extending therefrom, wherein at least a portion of said guide pins are press fitted into one or more guide pin openings on the motherboard, and wherein said sensor is installed using a disposable carrier that holds said connector and protects the guide pins thereof prior to mounting said sensor module to the motherboard, wherein said disposable carrier is removed from the sensor module before said sensor module is mounted directly to the motherboard.

* * * * *